United States Patent
Tsuda

(10) Patent No.: US 9,654,081 B2
(45) Date of Patent: May 16, 2017

(54) ELECTRONIC COMPONENT AND MANUFACTURING METHOD THEREFOR

(71) Applicant: Murata Manufacturing Co., Ltd., Nagaokakyo-shi, Kyoto-fu (JP)

(72) Inventor: Motoji Tsuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/994,642

(22) Filed: Jan. 13, 2016

(65) Prior Publication Data

US 2016/0126931 A1 May 5, 2016

Related U.S. Application Data

(63) Continuation of application No. PCT/JP2013/069419, filed on Jul. 17, 2013.

(51) Int. Cl.
| | |
|---|---|
| H03H 9/10 | (2006.01) |
| H03H 9/64 | (2006.01) |
| H01L 41/053 | (2006.01) |
| H03H 9/02 | (2006.01) |
| H03H 3/08 | (2006.01) |
| H03H 9/54 | (2006.01) |
| H05K 9/00 | (2006.01) |

(52) U.S. Cl.
CPC ....... H03H 9/1092 (2013.01); H01L 41/0533 (2013.01); H03H 3/08 (2013.01);
(Continued)

(58) Field of Classification Search
CPC ........ H03H 3/02; H03H 3/08; H03H 9/02913; H03H 9/1071; H03H 9/1078; H03H 9/54; H03H 9/64; H03H 9/6433; H03H 9/6483; H03H 9/6489; H03H 9/1092; H05K 9/0007; H01L 41/0533
(Continued)

(56) References Cited

U.S. PATENT DOCUMENTS 6,078,229 A 6/2000 Funada et al.
6,150,748 A 11/2000 Fukiharu
(Continued)

FOREIGN PATENT DOCUMENTS

JP 10-173468 * 6/1998
JP 11-55066 A 2/1999
(Continued)

OTHER PUBLICATIONS

Official Communication issued in International Patent Application No. PCT/JP2013/069419, mailed on Sep. 24, 2013.

Primary Examiner — Barbara Summons
(74) Attorney, Agent, or Firm — Keating & Bennett, LLP

(57) ABSTRACT

In an electronic component, a functional circuit, signal wiring electrically connected to the functional circuit, and ground wiring electrically connected to the functional circuit and electrically connected to a ground potential are located on one surface of a circuit substrate, a frame member is provided to secure a region between itself and an outer peripheral edge of a first main surface of the circuit substrate and so as to surround the functional circuit, the ground wiring extends from inside to outside the frame member, and a shield member extends from a second main surface of the circuit substrate to a region on the first main surface via the side surfaces, the shield member being electrically connected to the ground wiring in the region outside the frame member.

20 Claims, 24 Drawing Sheets

(52) U.S. Cl.
CPC ...... *H03H 9/02913* (2013.01); *H03H 9/1071* (2013.01); *H03H 9/1078* (2013.01); *H03H 9/54* (2013.01); *H03H 9/64* (2013.01); *H05K 9/0007* (2013.01)

(58) Field of Classification Search
USPC .................................. 333/133, 189, 193, 195
See application file for complete search history.

(56) References Cited

U.S. PATENT DOCUMENTS

| | | | | |
|---|---|---|---|---|
| 7,291,904 | B2* | 11/2007 | Matsuda | H03H 9/0071 257/414 |
| 7,436,273 | B2* | 10/2008 | Onozawa | H03H 3/02 29/25.35 |
| 2005/0071971 | A1 | 4/2005 | Yamato | |
| 2012/0139091 | A1* | 6/2012 | Wakabayashi | H01L 23/552 257/659 |
| 2012/0181898 | A1* | 7/2012 | Hatakeyama | H03H 3/02 310/313 B |

FOREIGN PATENT DOCUMENTS

| | | |
|---|---|---|
| JP | 11-239037 A | 8/1999 |
| JP | 2005-117151 A | 4/2005 |
| JP | 2007-165949 A | 6/2007 |
| JP | 2007-294829 A | 11/2007 |
| JP | 2010-272848 A | 12/2010 |
| JP | 2011-91616 A | 5/2011 |
| JP | 2011-124743 A | 6/2011 |
| JP | 2012-29134 A | 2/2012 |

* cited by examiner

ELECTRONIC COMPONENT AND MANUFACTURING METHOD THEREFOR

BACKGROUND OF THE INVENTION

1. Field of the Invention

The present invention relates to an electronic component in which a functional circuit is provided on a circuit substrate and to a manufacturing method therefor, and more specifically relates to an electronic component including an electromagnetic shield structure and to a manufacturing method therefor.

2. Description of the Related Art

To date, in order to reduce the size of electronic appliances, a method in which electronic components are mounted on a mounting substrate using flip chip bonding or the like has often been used. For example, in Japanese Unexamined Patent Application Publication No. 2005-117151, a surface acoustic wave device, which is one example of such an electronic component, is disclosed.

In the surface acoustic wave device described in Japanese Unexamined Patent Application Publication No. 2005-117151, an electrode structure that includes interdigital transducers (IDTs) is formed on a piezoelectric substrate. A functional circuit that functions as a surface acoustic wave element is realized by this electrode structure.

The electronic component described in Japanese Unexamined Patent Application Publication No. 2005-117151 is mounted by flip chip bonding on a mounting substrate. In this case, the surface of the piezoelectric substrate on which the functional circuit is formed is arranged so as to face the mounting substrate.

It is strongly required that the functional circuit of the electronic component described in Japanese Unexamined Patent Application Publication No. 2005-117151 be electromagnetically shielded. In the electronic component, the surface of the piezoelectric substrate on which the functional circuit is formed is arranged so as to face the mounting substrate. Therefore, to date, it has been necessary to form a shield member for electromagnetically shielding the functional circuit on the mounting substrate.

On the other hand, a method in which a sealing layer is formed using a resin material having conductivity so as to cover an electronic component is also known. In such a case, a functional circuit section within the electronic component can be electromagnetically shielded on the electronic component side. However, the resin material layer having conductivity has to be formed in order to achieve the electromagnetic shielding function. Therefore, there has been a problem in that the external dimensions, in particular the thickness, of the electronic component are increased.

SUMMARY OF THE INVENTION

Preferred embodiments of the present invention provide an electronic component that has an excellent electromagnetic shielding property as a standalone electronic component and that has a greatly reduced size, and a manufacturing method therefor.

An electronic component according to a preferred embodiment of the present invention includes a circuit substrate, a functional circuit, signal wiring, ground wiring, a frame member and a shield member. The circuit substrate includes first and second main surfaces that oppose each other, and side surfaces that connect the first and second main surfaces to each other. A functional circuit is provided on the first main surface of the circuit substrate. The signal wiring is provided on the first main surface of the circuit substrate and is electrically connected to the functional circuit.

The ground wiring includes a wiring portion that is provided on the first main surface of the circuit substrate, and the ground wiring is electrically connected to the functional circuit, and is electrically connected to a ground potential.

A frame member is provided so as to secure a region between itself and an outer peripheral edge of the first main surface of the circuit substrate and so as to surround the functional circuit.

In a preferred embodiment of the present invention, the ground wiring extends from inside to outside the frame member. In addition, a shield member extends from the second main surface of the circuit substrate to the region outside the frame member on the first main surface of the circuit substrate via the side surfaces, the shield member including a conductive material so as to be electrically connected to the ground wiring in the region outside the frame member.

In a certain specific aspect of an electronic component according to a preferred embodiment of the present invention, a partition wall is further included that extends toward the outer peripheral edge of the first main surface from an outer peripheral edge of the frame member. The region outside the frame member is divided into a first area and a second area by the partition wall. The ground wiring is arranged in the first area and the signal wiring so as to extend into the second area.

In another specific aspect of an electronic component according to a preferred embodiment of the present invention, the shield member covers an entirety of each of the second main surface and the side surfaces of the circuit substrate.

In yet another specific aspect of an electronic component according to a preferred embodiment of the present invention, a cover member is further included that is bonded to the frame member so as to close an opening of the frame member.

In yet another specific aspect of an electronic component according to a preferred embodiment of the present invention, the frame member includes a first through hole that faces the signal wiring and a second through hole that faces the ground wiring, and the electronic component further includes first and second conductive members with which the first and second through holes are filled.

In yet another specific aspect of an electronic component according to a preferred embodiment of the present invention, the cover member has third and fourth through holes that are continuous with the first and second through holes, and the first and second conductive members respectively extend into the third and fourth through holes.

A method of manufacturing an electronic component according to another preferred embodiment of the present invention includes the following steps:

(A) a step of preparing a circuit substrate including first and second main surfaces that oppose each other, and side surfaces that connect the first and second main surfaces to each other;

(B) a step of forming a functional circuit on the first main surface of the circuit substrate;

(C) a step of forming, on the first main surface of the circuit substrate, signal wiring that is electrically connected to the functional circuit, and ground wiring that is electrically connected the functional circuit and that is electrically connected to a ground potential;

(D) a step of forming a frame member on the first main surface of the circuit substrate so as to surround the functional circuit and so as to secure a region between itself and an outer peripheral edge of the circuit substrate; and (E) a step of forming a shield member that includes a conductive material such that the shield member extends from the second main surface of the circuit substrate to a region outside of the frame member on the first main surface via the side surfaces and such that the shield member is electrically connected to the ground wiring.

In a certain specific aspect of a method of manufacturing an electronic component according to a preferred embodiment of the present invention, the steps (A) to (E) are performed on a mother circuit substrate. A plurality of electronic component forming sections are formed on the mother circuit substrate with the shield member being provided so as to extend between adjacent electronic component forming sections. The mother circuit substrate, on which the plurality of electronic component forming sections are formed, and the shield member are divided into individual electronic components by being cut.

In another specific aspect of a method of manufacturing an electronic component according to a preferred embodiment of the present invention, a step of forming a cover member so as to close an opening of the frame member is further included.

In yet another specific aspect of a method of manufacturing an electronic component according to a preferred embodiment of the present invention, further included is a step of forming a partition wall that extends toward the outer peripheral edge of the first main surface of the circuit substrate from the frame member, so that the region is divided into a first area and a second area by the partition wall. The partition wall is formed such that the ground wiring is located in the first area and the signal wiring is located in the second area.

In an electronic component according to a preferred embodiment of the present invention, since the frame member surrounds the functional circuit and the shield member extends from the second main surface to a region outside of the frame member via the side surfaces as described above, the functional circuit is effectively electromagnetically shielded without causing an increase in the size of the electronic component. Therefore, there is no need to provide a shield member to electromagnetically shield the electronic component on the mounting substrate.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
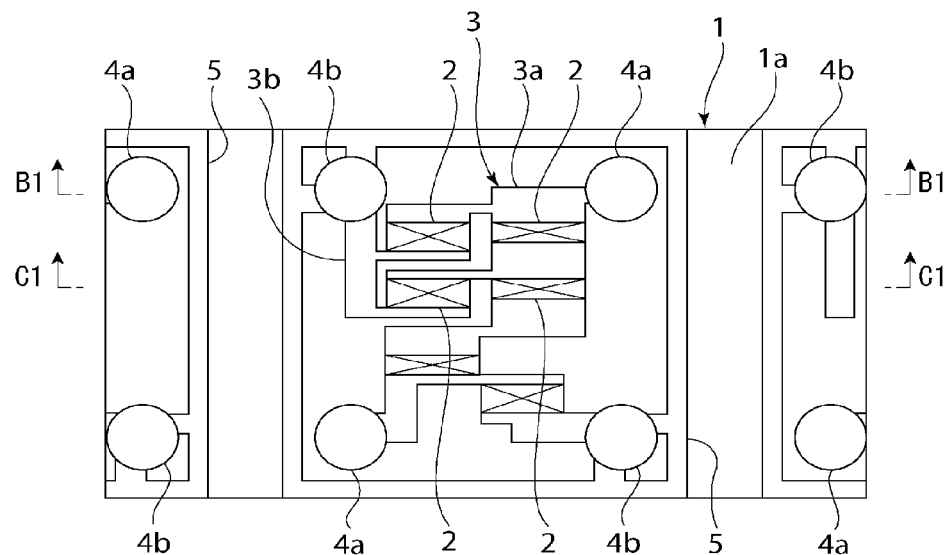
FIG. 1A is a plan view for explaining a manufacturing step of a first preferred embodiment of the present invention.

Hereafter, the present invention will be made clear by describing specific preferred embodiments of the present invention while referring to the drawings.

A manufacturing method for an electronic component and an electronic component according to preferred embodiments of the present invention will be described with reference to FIGS. 1 to 10.

In this preferred embodiment, as will be described below, a surface acoustic wave device illustrated in FIG. 10 is fabricated as an electronic component.

As illustrated in FIG. 1A, a mother piezoelectric substrate 1 is prepared. As the piezoelectric substrate 1, a piezoelectric substrate composed of an appropriate piezoelectric material such as $LiTaO_3$ can be used.

Figure 1B:
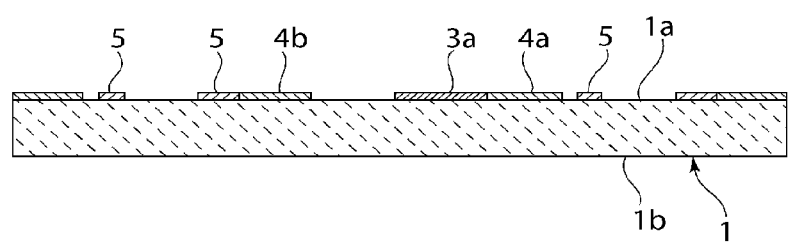
FIG. 1B and FIG. 1C are sectional views taken along the line B1-B1 and the line C1-C1 in FIG. 1A.
Figure 1C:
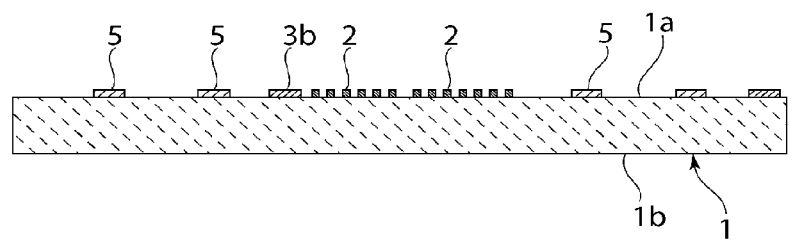

A metal film composed of for example Al is deposited over the entire upper surface, which is a first main surface, of the mother piezoelectric substrate 1 and is patterned using photolithography. As a result, the electrode structure illustrated in FIGS. 1A to 1C is formed. This electrode structure includes IDTs 2 each including a pair of comb-shaped electrodes, a wiring electrode 3 and pad electrodes 4a and 4b. The wiring electrode 3 includes signal wiring 3a and ground wiring 3b. In addition, in this step, shield wiring 5 is formed so as to surround a section corresponding to one surface acoustic wave element including a plurality of IDTs 2, which is a functional circuit. First and second conductive members 8a and 8b, which are used as bumps, are formed on pad electrodes 4a and 4b, as will be described later. That is, the pad electrodes 4a and 4b function as bonding layers, which are underbump metal layers.

Figure 2A:
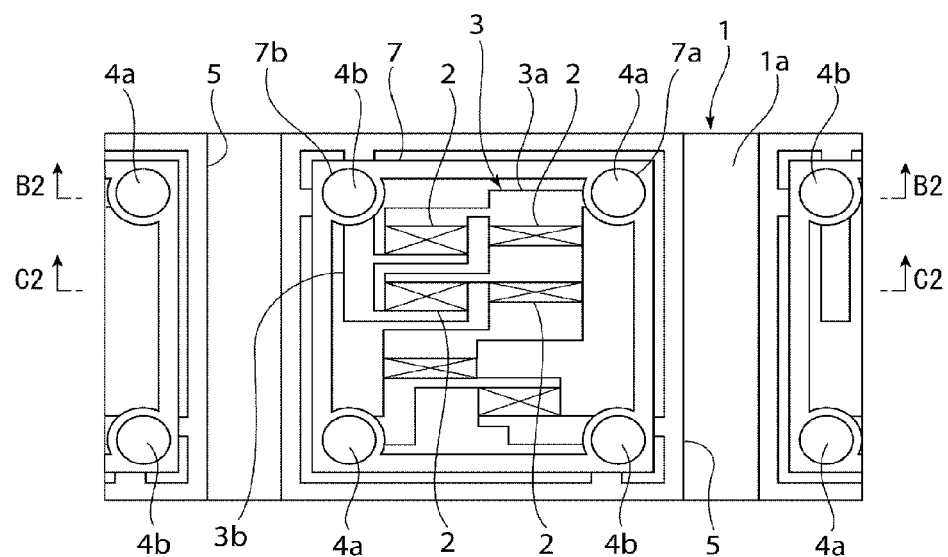
FIG. 2A is a plan view for explaining a manufacturing step of the first preferred embodiment of the present invention.
Figure 2B:
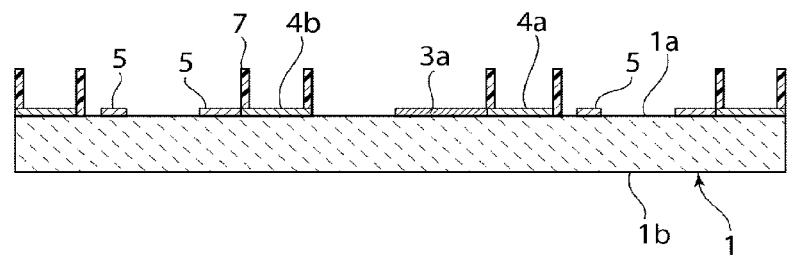
FIG. 2B and FIG. 2C are sectional views taken along the line B2-B2 and the line C2-C2 in FIG. 2A.
Figure 2C:
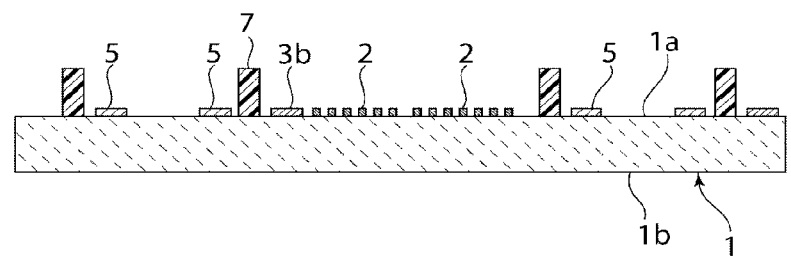

Next, a photosensitive resin is applied to the upper surface of the piezoelectric substrate 1 and patterning is performed by photolithography. As the photosensitive resin, a suitable photosensitive resin such as a photosensitive polyimide resin can be used. A frame member 7 illustrated in FIGS. 2A to 2C is formed by the patterning. The frame member 7 preferably has the shape of a rectangular or substantially rectangular frame. First through holes 7a and second through holes 7b are formed in corner portions of the frame member 7. At least a portion of each pad electrode 4a is exposed inside a corresponding first through hole 7a. Each pad electrode 4a is connected to the signal wiring 3a, which is connected to a signal potential, out of the wiring electrode 3. At least a portion of each pad electrode 4b is exposed inside a corresponding second through hole 7b. Each pad electrode 4b is connected to the ground wiring 3b, which is connected to a ground potential.

Next, portions other than the first and second through holes 7a and 7b are covered with a resist. Then, the first and second through holes 7a and 7b are filled with a metal by performing plating. As the metal, a suitable metal such as an alloy having Ni or Cu as a main component can be used. Then, the resist is removed.

As has been described above and illustrated in FIGS. 3A and 3B, the first and second conductive members 8a and 8b, which define and function as bumps or under bump metal layers, are formed inside the first and second through holes 7a and 7b. When they are to function as bumps, it is preferable that the first and second conductive members 8a and 8b be formed so that the height of the conductive members 8a and 8b is larger than that of the frame member 7. As a result, it will be possible to easily mount the finally obtained electronic component using flip chip bonding.

Figure 3A:
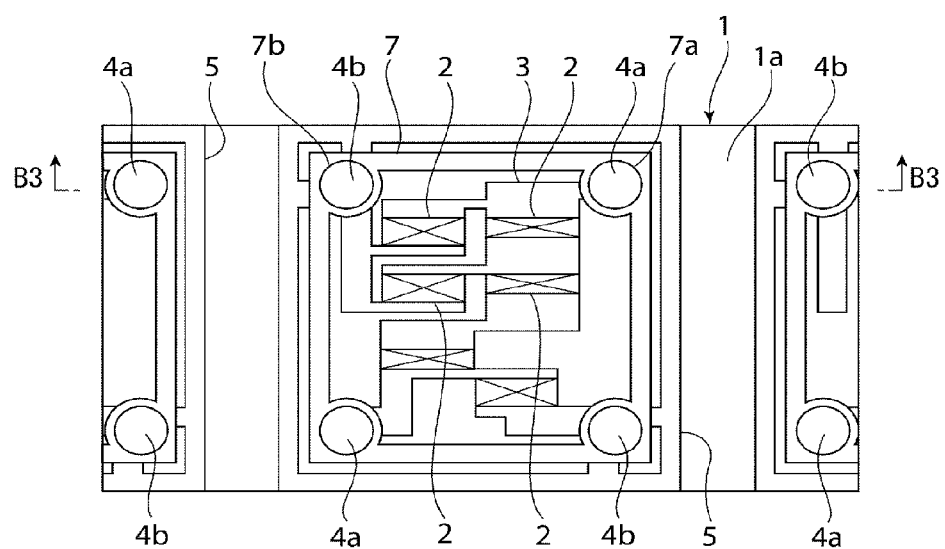
FIG. 3A is a plan view for explaining a manufacturing step of the first preferred embodiment of the present invention.
Figure 3B:
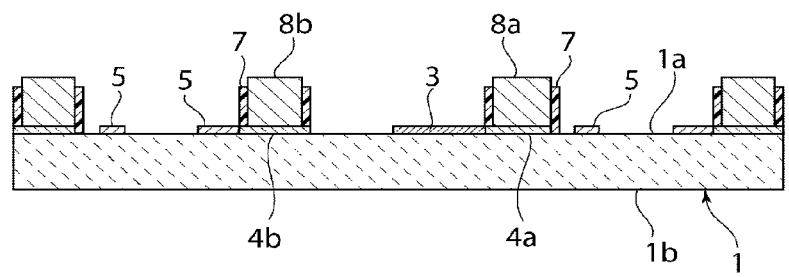
FIG. 3B is a sectional view of a portion taken along the line B3-B3 in FIG. 3A.
Figure 4A:
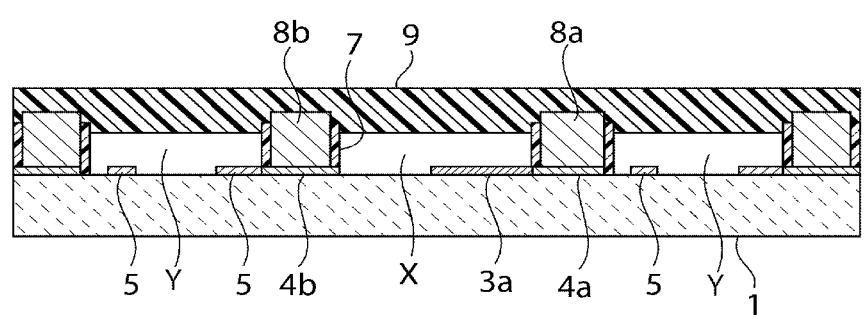
FIG. 4A and FIG. 4B are front sectional views for explaining a step of a manufacturing method for an electronic component of the first preferred embodiment of the present invention.
Figure 4B:
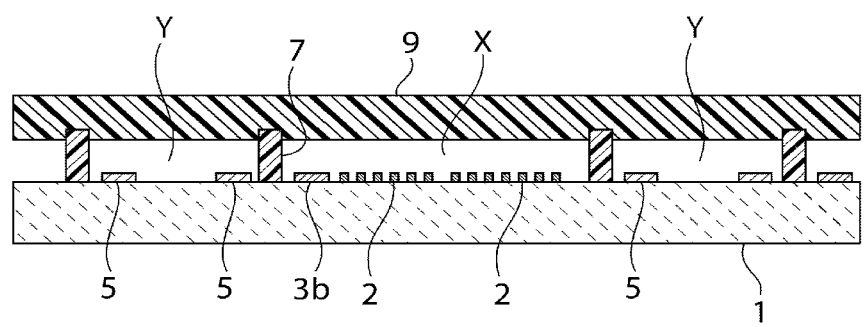

Next, as illustrated in FIG. 4A, dicing tape 9 is adhered from the upper surface side of the piezoelectric substrate 1. A portion the same as the sectional portion illustrated in FIG. 3B is illustrated in FIG. 4A. In addition, a sectional portion corresponding to the portion illustrated in FIG. 2C is illustrated in FIG. 4B.

As the dicing tape 9, a well known dicing tape whose lower surface, which is one main surface, is an adhesive surface can be used. The lower surface of the dicing tape 9 is adhered to the first and second conductive members 8a and 8b and the frame member 7. As illustrated in FIGS. 4A and 4B, in this state, a space X and spaces Y are formed between the lower surface of the dicing tape 9, the mother piezoelectric substrate 1 and the frame member 7.

Figure 5A:
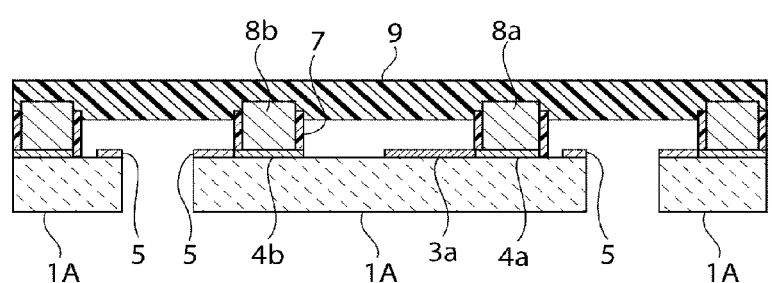
FIG. 5A and FIG. 5B are front sectional views for explaining a step of a manufacturing method for the electronic component of the first preferred embodiment of the present invention.
Figure 5B:
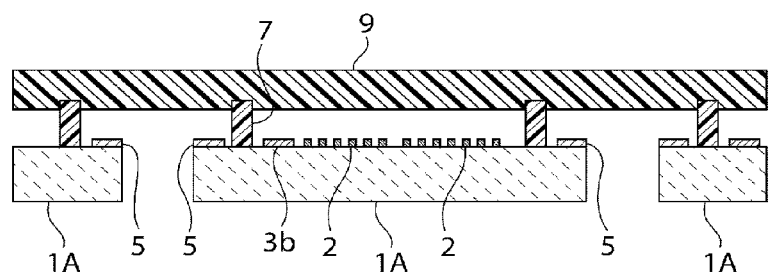

Next, the mother piezoelectric substrate 1 is diced into individual electronic component units without cutting the dicing tape 9. Sealing of the space X, which contains the IDTs 2, is maintained but openings are formed into the spaces Y. In addition, as illustrated in FIGS. 5A and 5B, the mother piezoelectric substrate 1 is divided into piezoelectric substrates 1A of individual electronic component units. Each piezoelectric substrate 1A corresponds to a circuit substrate.

Next, without removing the dicing tape 9, a conductive paste is applied from the lower surface side of the piezoelectric substrate 1A so as to be disposed in the spaces Y and on the cut surfaces and the lower surface, which is a second main surface, of the piezoelectric substrate 1A, and is then cured by heating or cooling. In this way, as illustrated in FIGS. 6A and 6B, a shield member 10 is formed in one step at predetermined positions on a plurality of electronic components.

As the conductive paste, a composition in which a conductive material is contained in a heat curable resin, a thermoplastic resin or any of various chemically curable resins can be used.

Figure 6A:
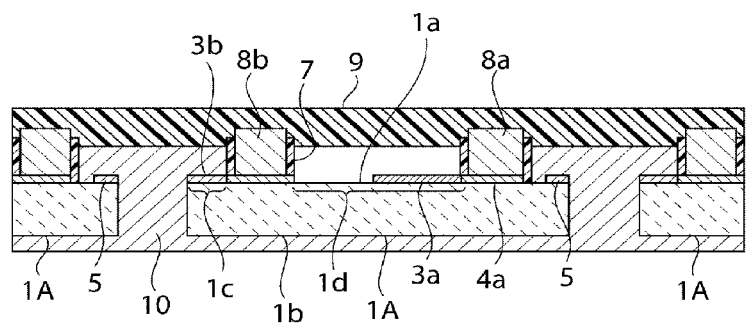
FIG. 6A and FIG. 6B are front sectional views for explaining a step of the manufacturing method for the electronic component of the first preferred embodiment of the present invention.
Figure 6B:
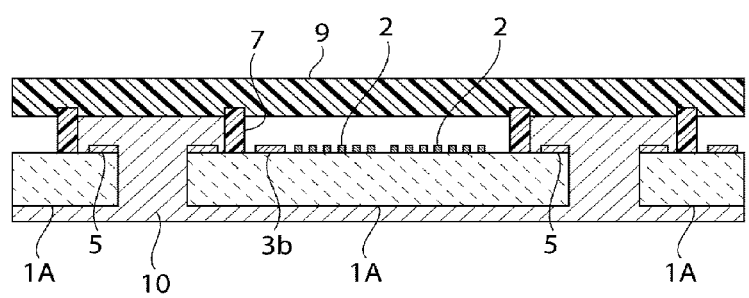

FIGS. 6A and 6B are sectional views of portions corresponding to FIGS. 5A and 5B. The shield member 10 covers the lower surface, which is the second main surface, of the piezoelectric substrate 1A. In addition, the shield member 10 fills the spaces between adjacent piezoelectric substrates 1A. Therefore, the shield member 10 extends from the lower surface of the piezoelectric substrate 1A to an upper surface 1a via side surfaces. On the upper surface 1a, which is the first main surface, of the piezoelectric substrate 1A, the shield member 10 extends to a region 1c outside of a portion where the frame member 7 is provided. It is to be noted that the shield member 10 does not reach a region 1d inside of the frame member 7.

By forming the shield member 10 in this way, the shield member 10 is electrically connected to the ground wiring 3b and the shield wiring 5, which are connected to the ground potential. The pad electrodes 4a, which are connected to the signal wiring 3a, are not exposed in the space Y outside of the frame member 7 and are not electrically connected to the shield member 10.

Figure 8A:
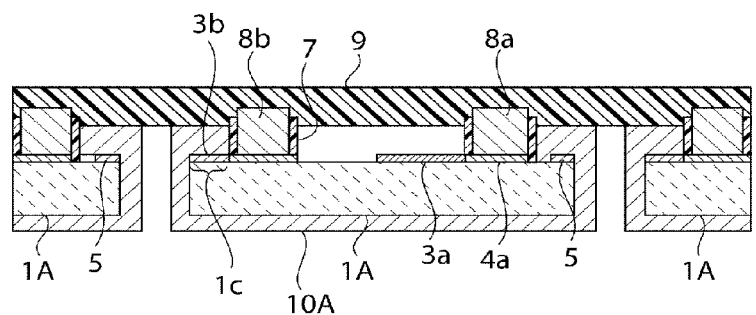
FIG. 8A and FIG. 8B are sectional views taken along the line A4-A4 and the line B4-B4 in FIG. 7.
Figure 8B:
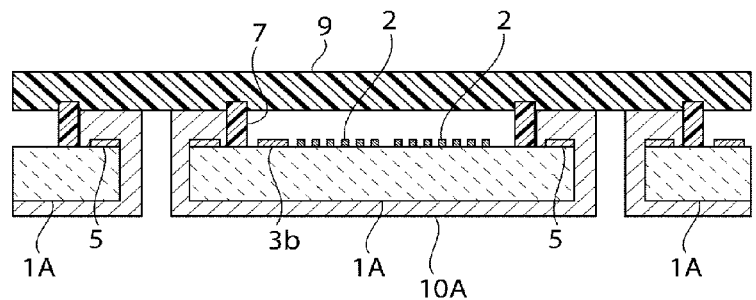

Next, portions of the shield member 10 are subjected to cutting to form individual electronic component units. In this case, the dicing tape 9 is preferably not removed from the electronic components. That is, as illustrated in FIG. 8A and FIG. 8B, the shield member 10 is cut at positions between adjacent piezoelectric substrates 1A. In this way, shield members 10A of individual electronic component units are formed.

Figure 7:
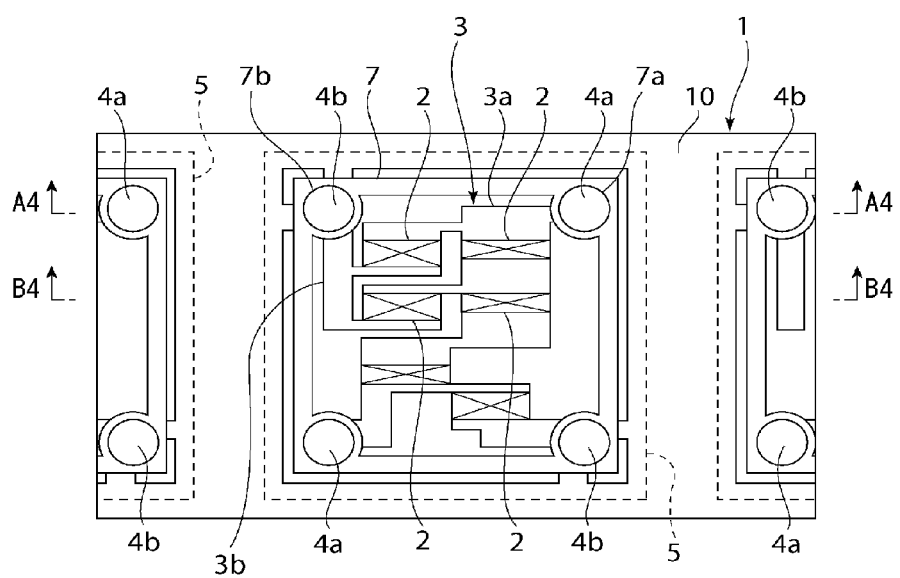
FIG. 7 is a plan view for explaining the manufacturing method for the electronic component of the first preferred embodiment of the present invention.

FIG. 7 is a schematic plan view in which the dicing tape 9 is omitted illustrating a state in which the shield member 10 is formed as illustrated in FIGS. 6A and 6B.

Figure 9:
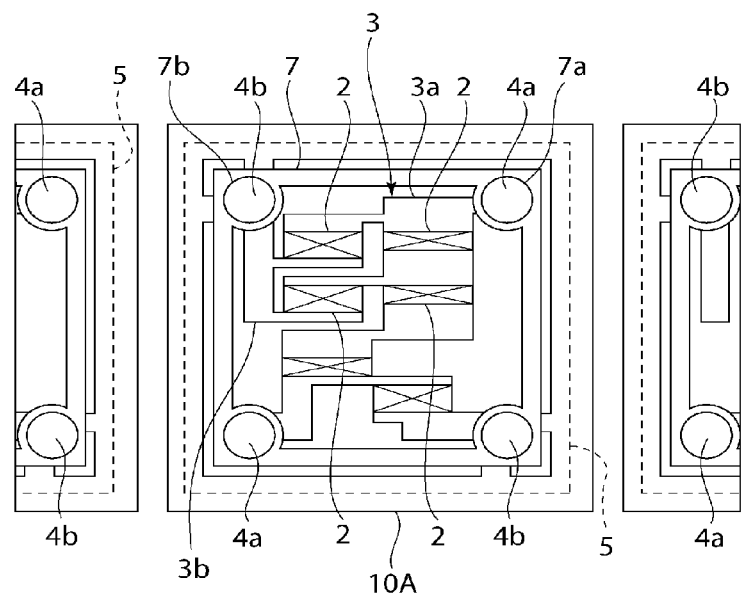
FIG. 9 is a plan view for explaining the manufacturing method for the electronic component of the first preferred embodiment of the present invention.

FIG. 9 is a plan view that schematically illustrates a state after the shield member 10 has been diced into a plurality of shield members 10A. Here, illustration of the dicing tape 9 has been omitted.

Figure 10A:
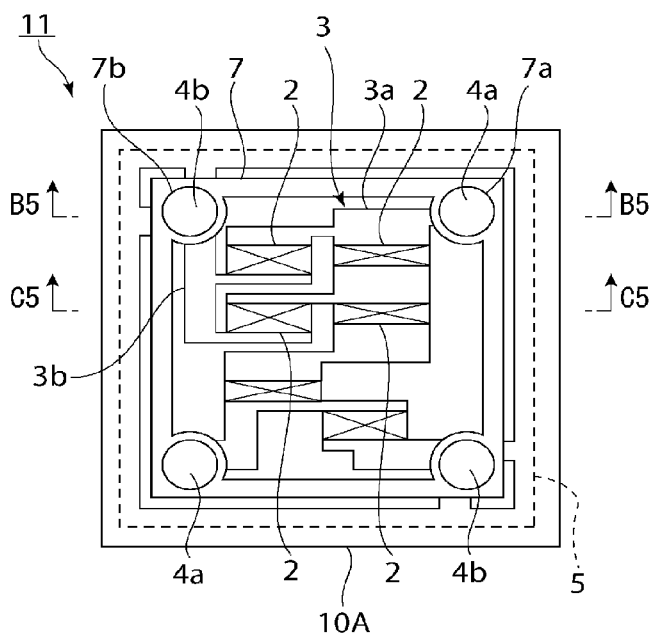
FIG. 10A is a plan view for explaining a manufacturing step of the electronic component of the first preferred embodiment of the present invention.

Next, the electronic components are removed from the dicing tape 9. In this way, an electronic component 11 of a first preferred embodiment illustrated in FIGS. 10A to 10C is obtained.

In the electronic component 11, the functional circuit including a plurality of IDTs 2 is located on the upper surface 1a of the piezoelectric substrate 1A, which defines and functions as a circuit substrate. In this preferred embodiment, a filter having a ladder circuit configuration is provided. On the other hand, in the electronic component 11, the shield member 10A covers the entirety of the lower surface 1b, which is the second main surface of the piezoelectric substrate 1A. In addition, the entirety of each of the four side surfaces of the piezoelectric substrate 1A are covered by the shield member 10A. Moreover, the shield member 10A extends over a region 1c on the upper surface 1a of the piezoelectric substrate 1A. Therefore, the functional circuit is electromagnetically shielded with certainty from the outside by the shield member 10A.

Figure 10B:
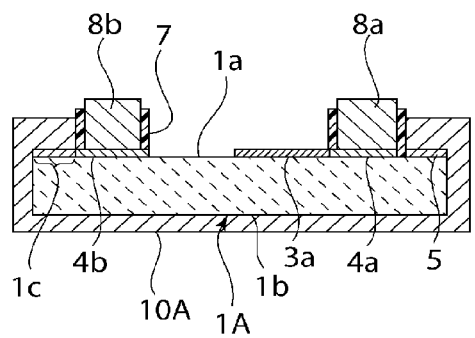
FIG. 10B and FIG. 10C are sectional views taken along the line B5-B5 and the line C5-C5 in FIG. 10A.
Figure 10C:
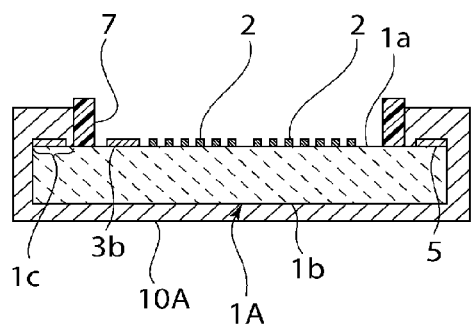

When mounting the electronic component 11, the electronic component 11 can be inverted from the orientation illustrated in FIGS. 10B and 10C and mounted on a mounting substrate by using a flip chip bonding method. In this case, even though a shield member is not provided on the mounting substrate, the functional circuit is surrounded by the shield member 10A in the mounted state. Therefore, there is no need to prepare a mounting substrate having a complex structure and there is no need to provide, separately to the electronic component 11, a shield member that covers the electronic component 11.

In addition, the shield member 10A is lower than an upper end of the frame member 7 on the surface of the piezoelectric substrate 1A on which the functional circuit is provided. Therefore, even though the shield member 10A is provided, the thickness of the electronic component 11 is not greatly increased. Therefore, a low profile is achieved for the electronic component 11.

Figure 11A:
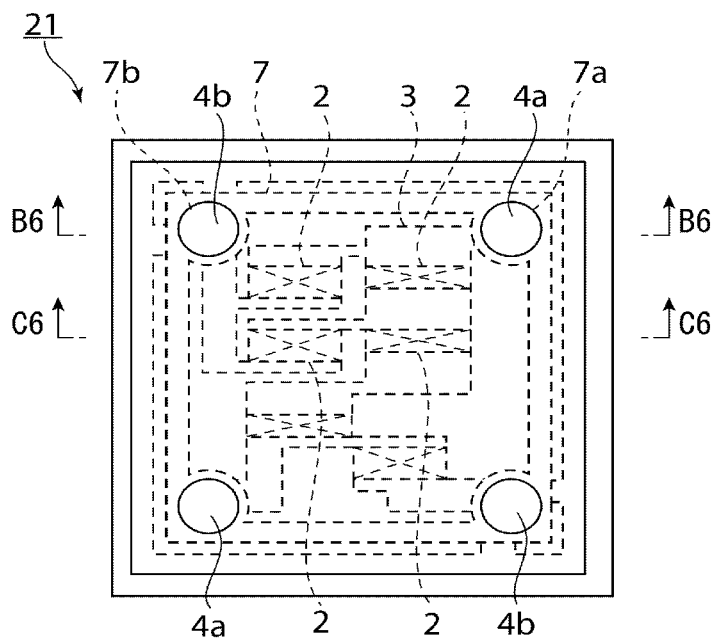
FIG. 11A is a plan view for explaining a manufacturing step of an electronic component according to a second preferred embodiment of the present invention.
Figure 11B:
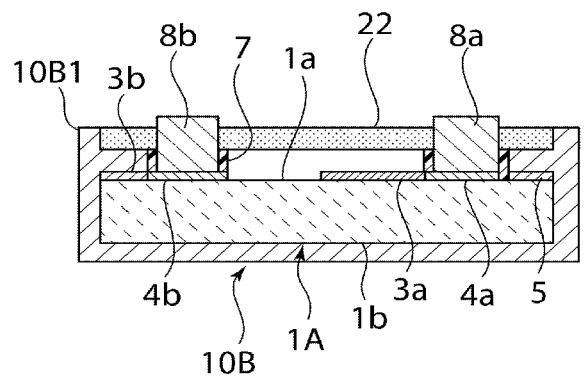
FIG. 11B and FIG. 11C are sectional views taken along the line B6-B6 and the line C6-C6 in FIG. 11A.
Figure 11C:
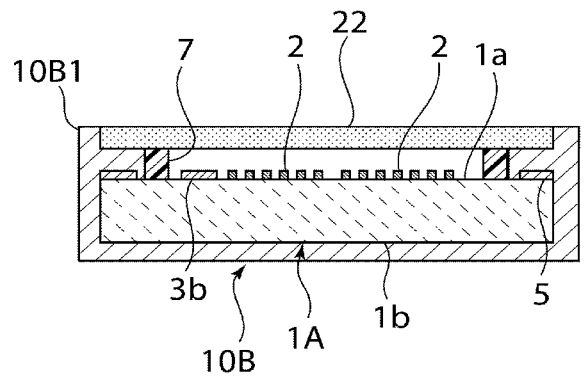

FIG. 11A is a plan view of a second preferred embodiment of the present invention and FIGS. 11B and 11C are sectional views respectively taken along the line B6-B6 and the line C6-C6 in FIG. 11A. In an electronic component 21 of this preferred embodiment, a cover member 22 is provided above the piezoelectric substrate 1A. Here, a shield member 10B extends over the region 1c on the upper surface 1a of the piezoelectric substrate 1A, similarly to as in the first preferred embodiment. In addition, the shield member 10B includes a protruding frame 10B1 that protrudes upward from a portion that covers the side surfaces of the piezoelectric substrate 1A. The cover member 22 is located in a region that is surrounded by the protruding frame 10B1.

An upper surface of the cover member 22 is lower than upper ends of the first and second conductive members 8a and 8b. In addition, a lower surface of the cover member 22 is in contact with an upper end of the frame member 7. The cover member 22 is composed of an insulating resin. A sealed space that is enclosed by the piezoelectric substrate 1, the frame member 7 and the cover member 22 is provided and therefore, in this preferred embodiment, the resistance to moisture and so forth of the electronic component is increased and the electrical characteristics of the functional circuit inside the sealed space are stabilized.

In addition, in the case of a functional circuit including an element that is a source of heat when IDTs and so forth are operating, there is a problem in that the temperature of the piezoelectric substrate rises due to the generated heat and the electrical characteristics of the electronic component 11 vary. In particular, in the case of an element arranged inside the sealed space sealed by the piezoelectric substrate 1A, the frame member 7 and the cover member 22, the increase in the temperature of the piezoelectric substrate caused by the generated heat is large. However, since the ground wiring 3b is arranged on the first main surface of the piezoelectric substrate 1A so as to extend from the inside to the outside of the sealed space, heat inside the sealed space is transmitted to outside the sealed space via the ground wiring 3b. The temperature increase of the functional circuit provided on the first main surface of the piezoelectric substrate 1A is suppressed by transmitting the heat using the ground wiring 3b and variations in the electrical characteristics caused by the temperature of the electronic component 11 are stabilized. In this case, it is preferable that the thermal conductivity of the ground wiring 3b be higher than the thermal conductivity of the piezoelectric substrate 1A.

The rest of the structure preferably is the same as that of the first preferred embodiment. Profile reduction is facilitated and an excellent electromagnetic shielding function is achieved in the electronic component 21 of the second preferred embodiment, similarly to as in the first preferred embodiment.

A method of manufacturing the electronic component 21 of the second preferred embodiment will be described with reference to FIGS. 12A to 17C.

Figure 12A:
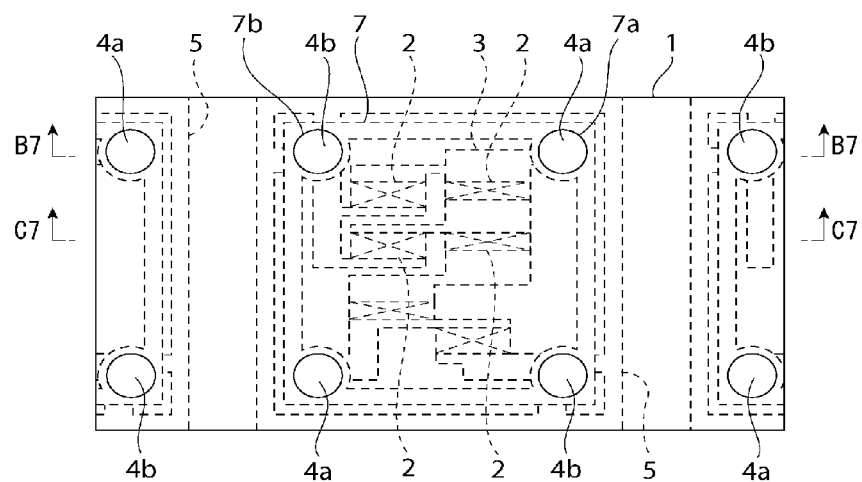
FIG. 12A is a plan view for explaining a manufacturing step of the electronic component according to the second preferred embodiment of the present invention.
Figure 12B:
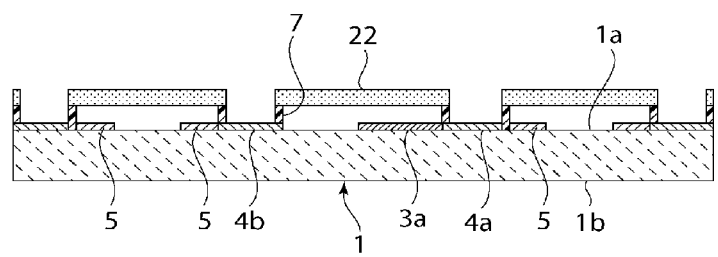
FIG. 12B and FIG. 12C are sectional views taken along the line B7-B7 and the line C7-C7 in FIG. 12A.
Figure 12C:
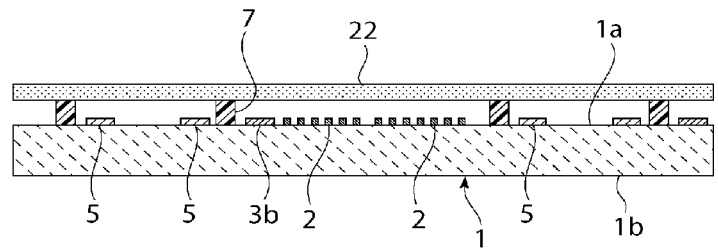

As illustrated in FIGS. 12A to 12C, the electrode structure and the frame member 7 are formed on the mother piezoelectric substrate 1, similarly to as in the first preferred embodiment. Then, a photosensitive resin sheet is adhered to the frame member 7 and patterned by photolithography. As a result, the cover member 22 can be formed. In addition, the patterning is performed such that third and fourth through holes 22a and 22b (refer to FIG. 13) that are continuous with the first and second through holes 7a and 7b are formed in the cover member 22.

Figure 13:
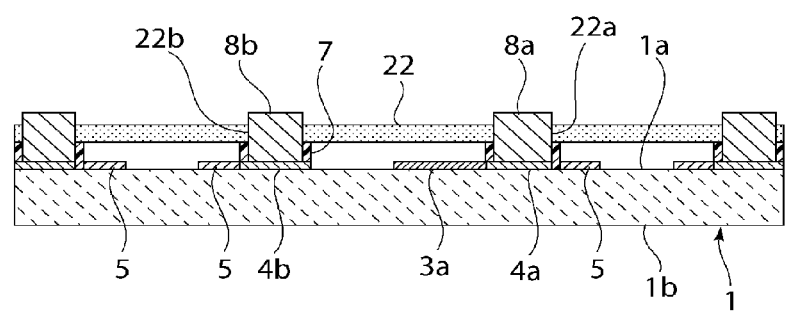
FIG. 13 is a sectional view for explaining a manufacturing step for the electronic component of the second preferred embodiment of the present invention.

Then, similarly to as in the first preferred embodiment, the first and second through holes 7a and 7b are filled with a metal by using plating. In this way, as illustrated in FIG. 13, the first and second conductive members 8a and 8b are formed.

Figure 14A:
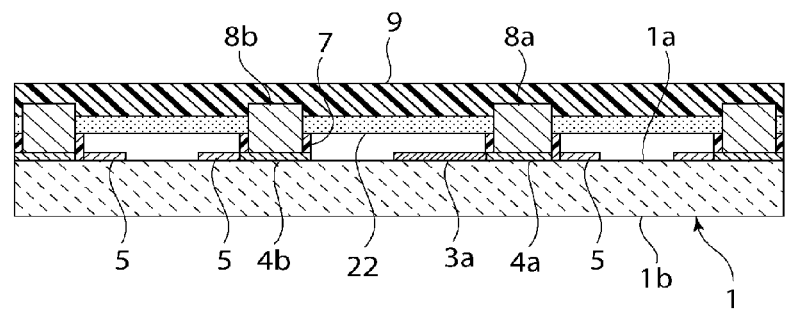
FIG. 14A and FIG. 14B are front sectional views for explaining the manufacturing method for the electronic component of the second preferred embodiment of the present invention.
Figure 14B:
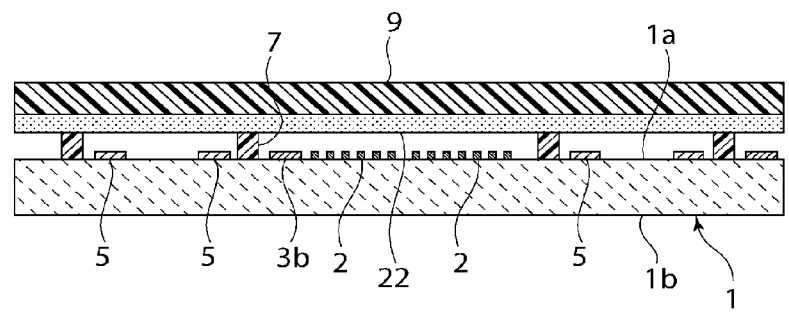
Figure 15A:
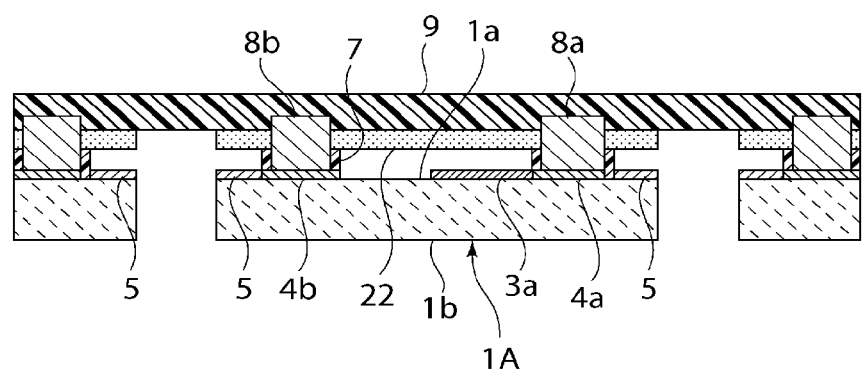
FIG. 15A and FIG. 15B are front sectional views for explaining the manufacturing method for the electronic component of the second preferred embodiment of the present invention.
Figure 15B:
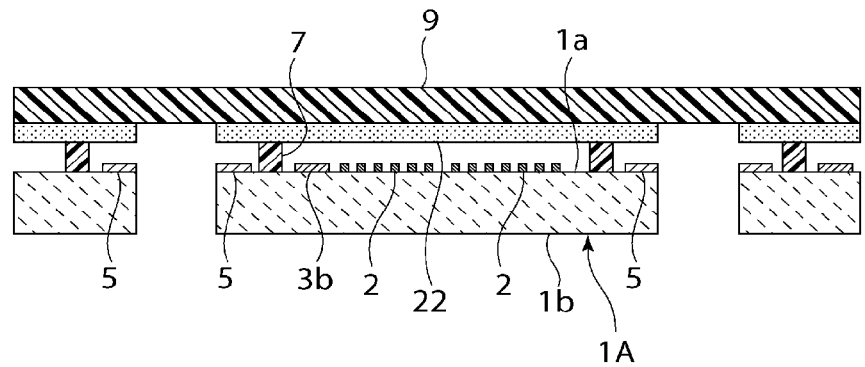
Figure 16A:
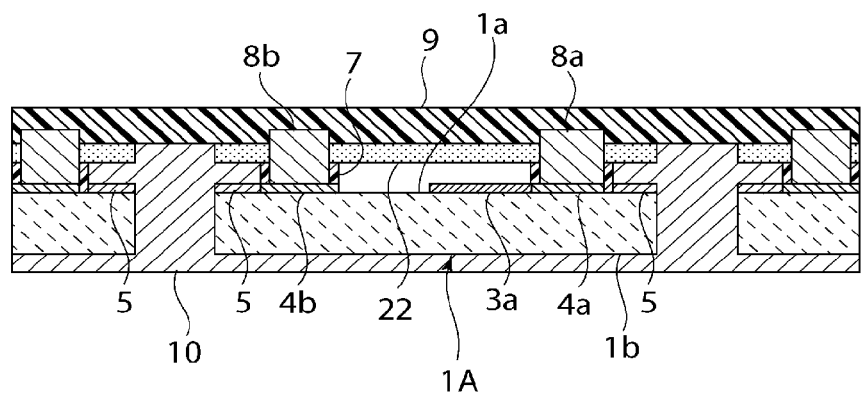
FIG. 16A and FIG. 16B are front sectional views for explaining the manufacturing method for the electronic component of the second preferred embodiment of the present invention.
Figure 16B:
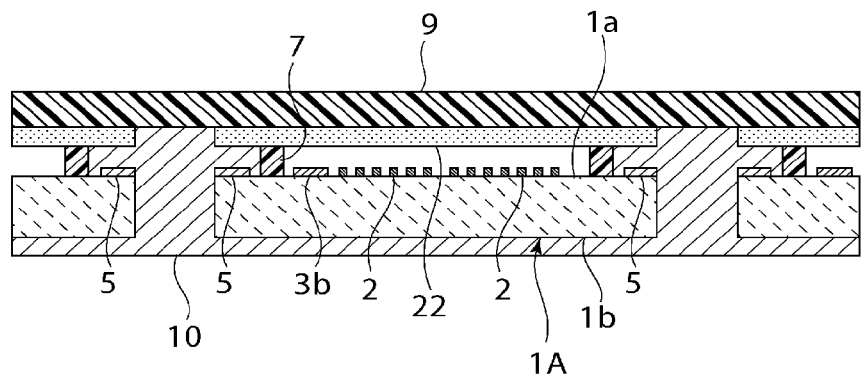
Figure 17A:
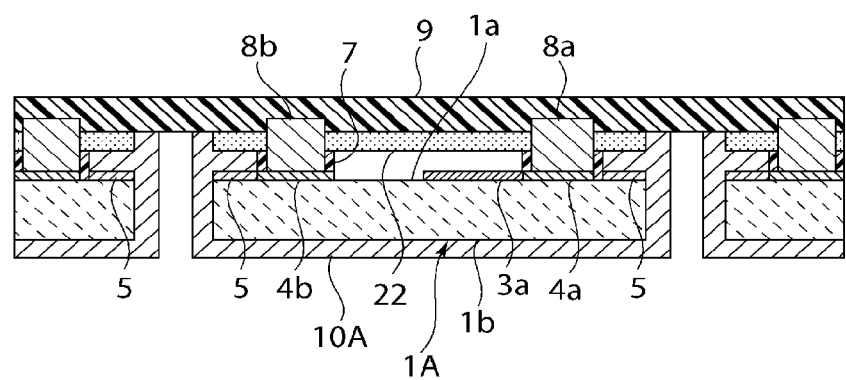
FIG. 17A and FIG. 17B are front sectional views for explaining the manufacturing method for the electronic component of the second preferred embodiment of the present invention.
Figure 17B:
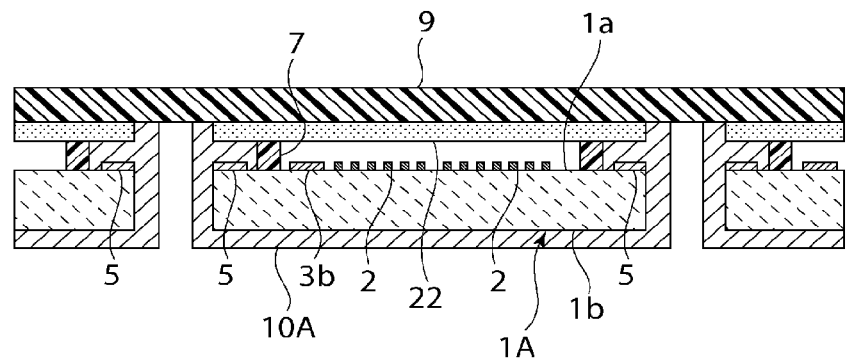

Next, as illustrated in FIGS. 14A and 14B, the dicing tape 9 is adhered to the upper surface. Then, the piezoelectric substrate 1 is diced into individual electronic component units without dicing the dicing tape 9. In this way, as illustrated in FIGS. 15A and 15B, the mother piezoelectric substrate is divided into a plurality of piezoelectric substrates 1A. Next, as illustrated in FIGS. 16A and 16B, the shield member 10 is applied from the lower surface side of the piezoelectric substrate 1A and cured. Then, as illustrated in FIGS. 17A and 17B, the mother piezoelectric substrate is divided into individual electronic component units. Finally, the electronic components are removed from the dicing tape 9. In this way, the electronic component 21 of the second preferred embodiment is obtained.

Figure 18A:
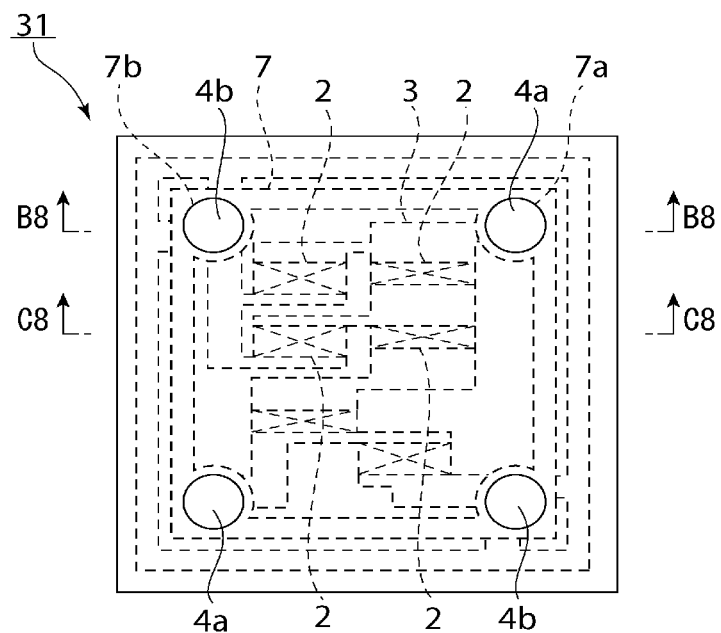
FIG. 18A is a plan view for explaining a manufacturing method for an electronic component according to a third preferred embodiment of the present invention.
Figure 18B:
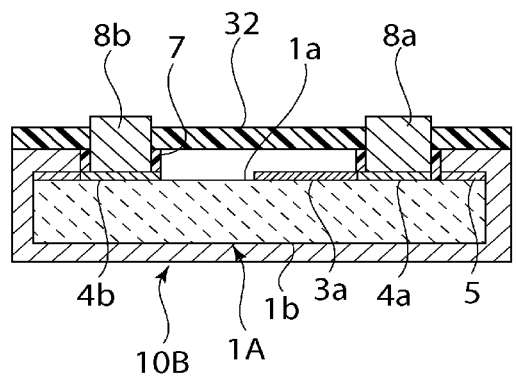
FIG. 18B and FIG. 18C are sectional views taken along the line B8-B8 and the line C8-C8 in FIG. 18A.
Figure 18C:
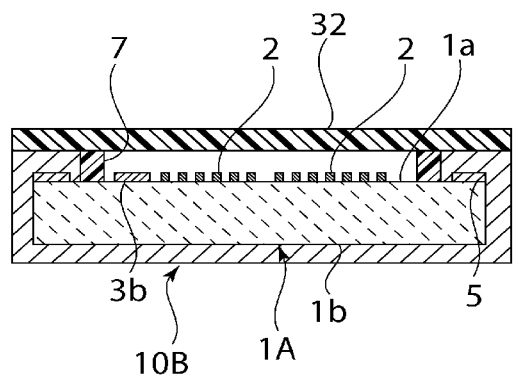

FIG. 18A is a plan view of an electronic component 31 according to a third preferred embodiment of the present invention, and FIGS. 18B and 18C are sectional views respectively taken along the line B8-B8 and the line C8-C8 in FIG. 18A.

This preferred embodiment differs from the second preferred embodiment in that a cover member 32 extends to an outer peripheral edge of the electronic component 31. That is, in the second preferred embodiment, the shield member 10B includes the protruding frame 10B1 and the cover member 22 is arranged inside the protruding frame 10B1. In contrast, here, the protruding frame 10B1 is not provided. In other words, this corresponds to a structure in which the cover member 32 is added to the electronic component 11 of the first preferred embodiment.

The steps of manufacturing the electronic component 31 of the third preferred embodiment can be performed in substantially the same way as in the second preferred embodiment. Of course, when the shield member 10 is diced into the shield members 10B of the individual electronic component units, the mother cover member is also diced and the cover member 32 is formed. In this preferred embodiment, since the side surfaces of the first and second conductive members 8a and 8b, which are electrically connected to the outside, are covered by the cover member 32, unwanted short circuits are suppressed.

Figure 19:
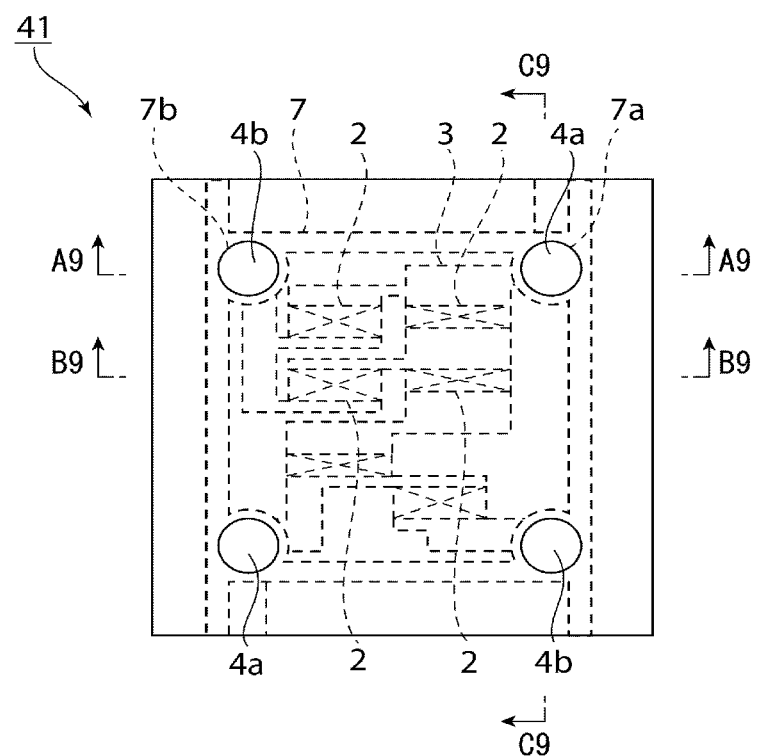
FIG. 19 is a plan view for explaining a manufacturing method for an electronic component of a fourth preferred embodiment of the present invention.
Figure 20A:
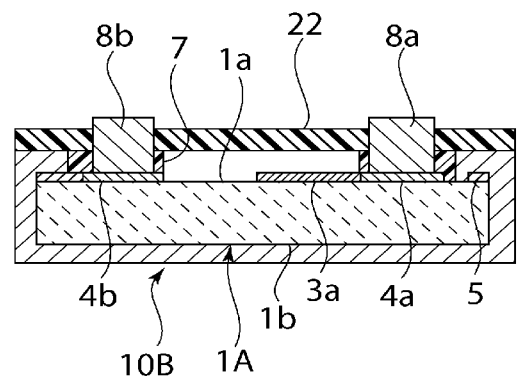
FIGS. 20A to 20C are sectional views taken along the line A9-A9, the line B9-B9 and the line C9-C9 in FIG. 19.
Figure 20B:
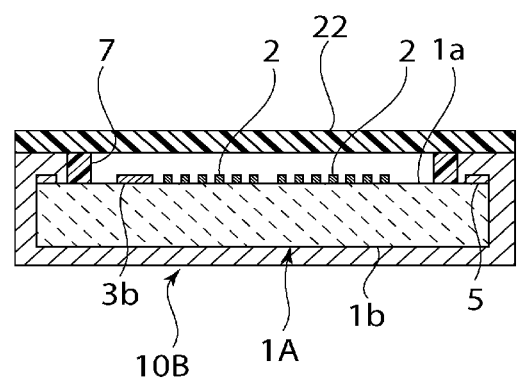
Figure 20C:
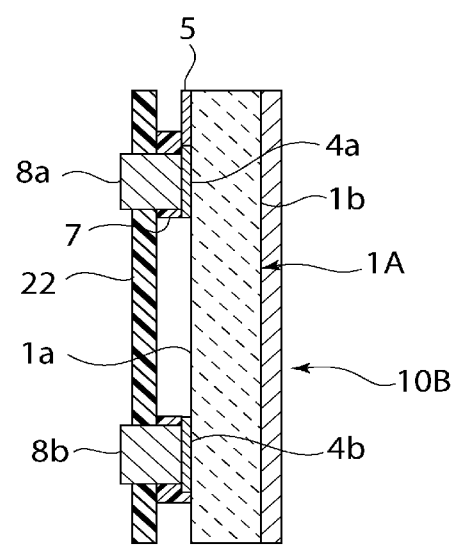

A method of manufacturing an electronic component 41 of a fourth preferred embodiment will be described with reference to FIGS. 19 to 25. FIG. 19 is a plan view illustrating the electronic component 41 of the fourth preferred embodiment and FIGS. 20A to 20C are sectional views taken along the line A9-A9, the line B9-B9 and the line C9-C9 in FIG. 19. First, a method of manufacturing the electronic component 41 will be described with reference to FIGS. 21 to 25.

Figure 21:
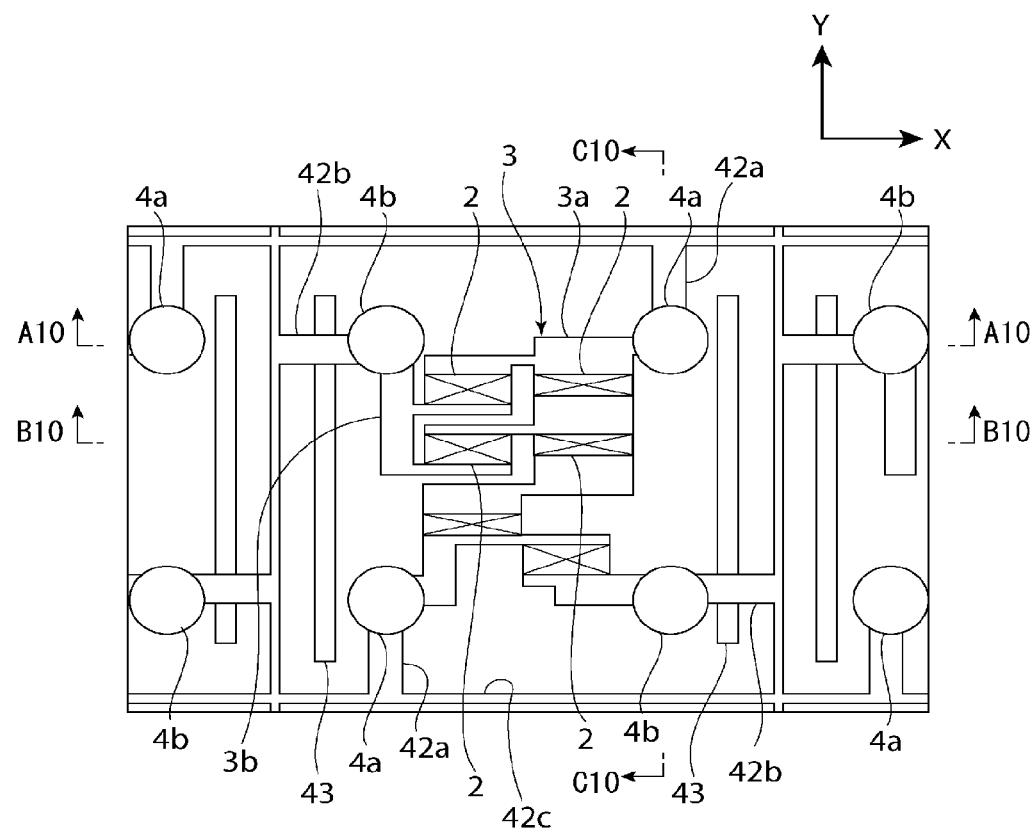
FIG. 21 is a plan view for explaining the manufacturing method for the electronic component of the fourth preferred embodiment of the present invention.
Figure 22A:
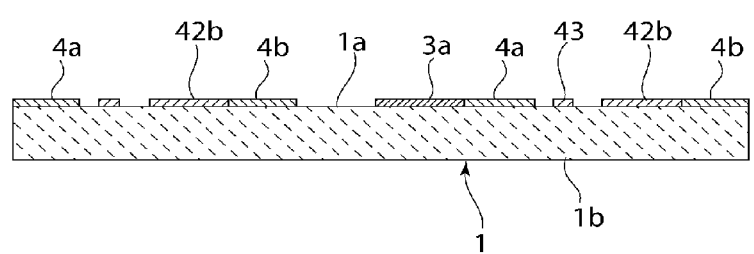
FIGS. 22A to 22C are sectional views taken along the line A10-A10, the line B10-B10 and the line C10-C10 in FIG. 21.
Figure 22B:
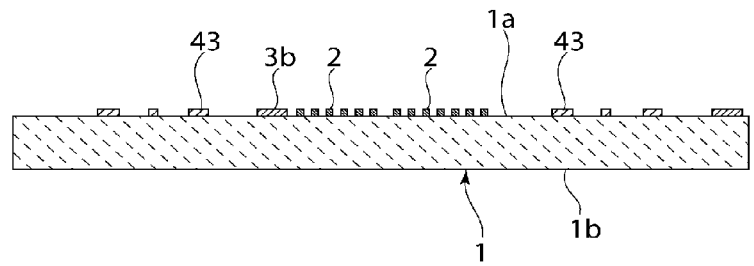
Figure 22C:
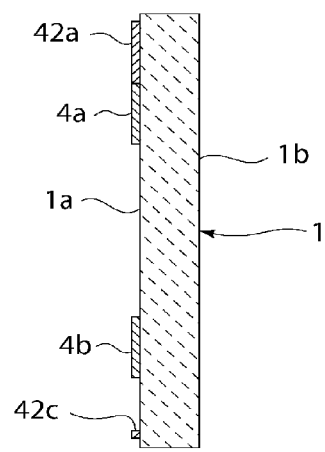
Figure 23:
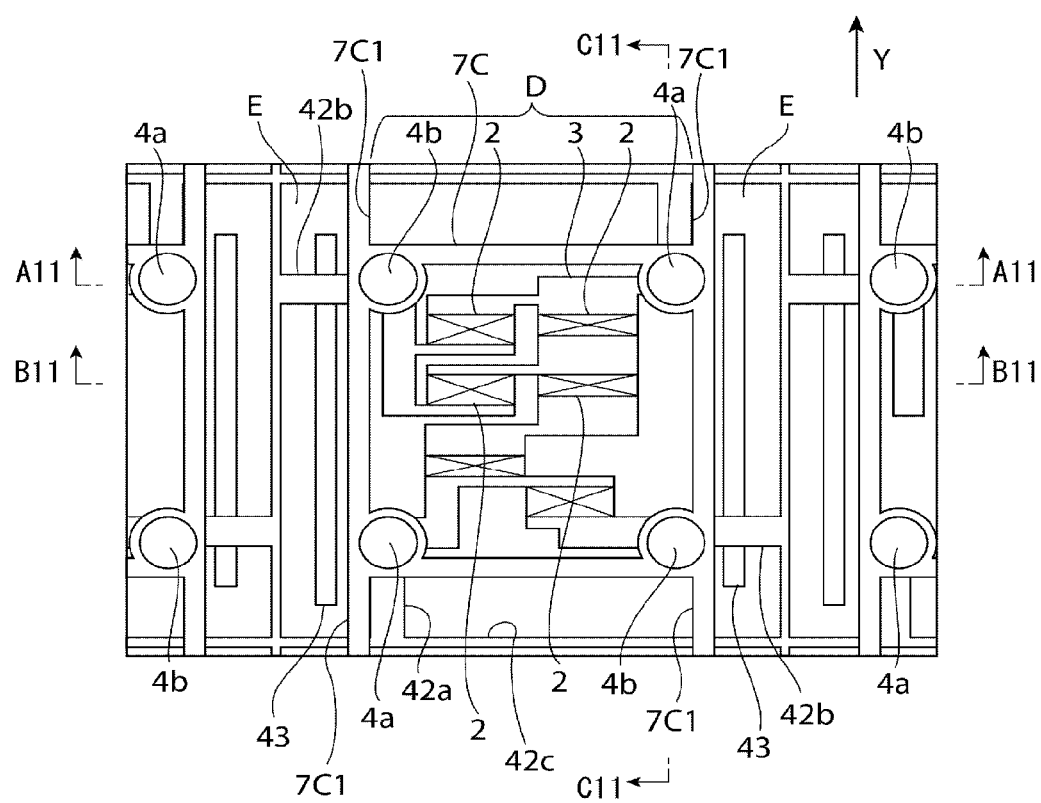
FIG. 23 is a plan view for explaining the manufacturing method for the electronic component of the fourth preferred embodiment of the present invention.
Figure 24A:
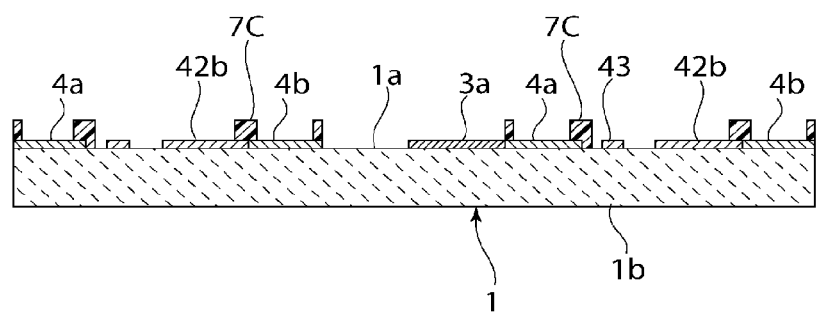
FIGS. 24A to 24C are sectional views taken along the line A11-A11, the line B11-B11 and the line C11-C11 in FIG. 23.
Figure 24B:
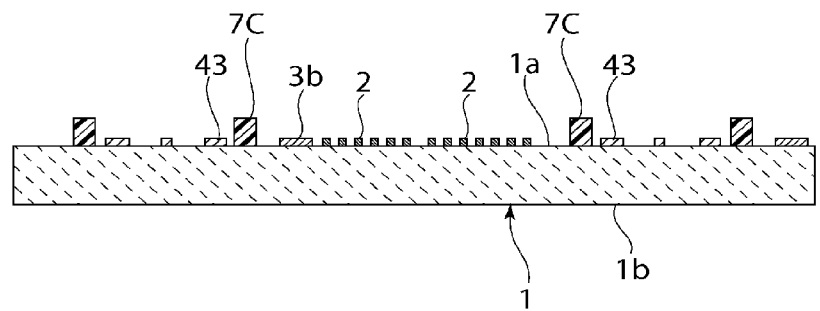
Figure 24C:
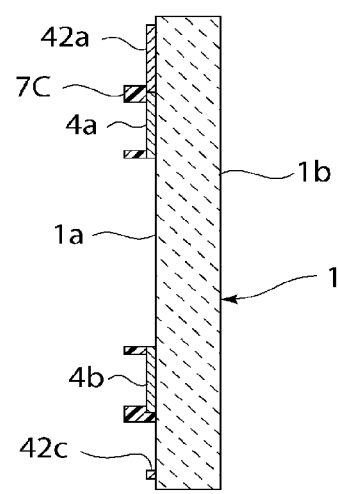
Figure 25:
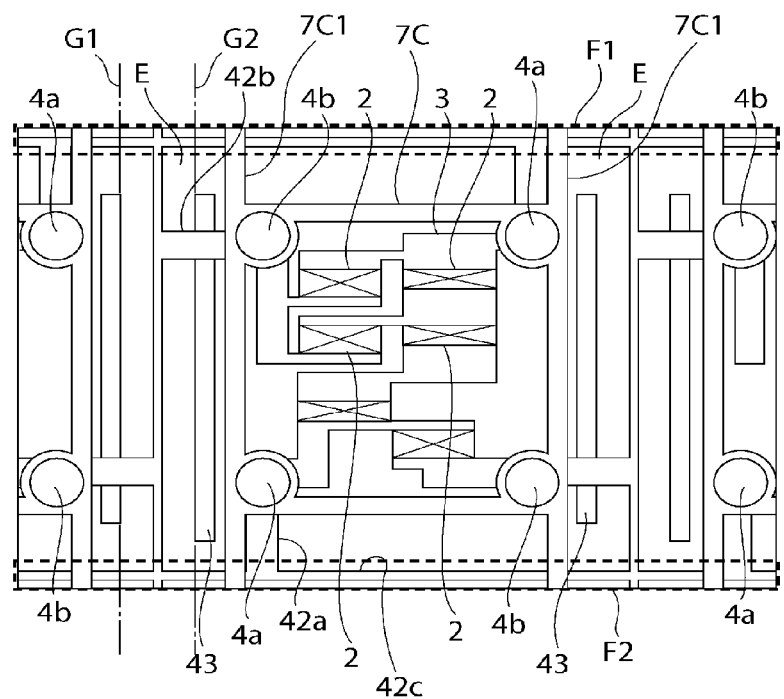
FIG. 25 is a plan view for explaining the manufacturing method for the electronic component of the fourth preferred embodiment of the present invention.

First, similarly to as in the first preferred embodiment, an electrode structure is formed on a mother piezoelectric substrate. As illustrated in FIG. 21, this electrode structure includes a plurality of IDTs 2, signal wiring 3a, ground wiring 3b and pad electrodes 4a and 4b.

In addition, in this preferred embodiment, a rectangular-frame-shaped power-feeding line 42c preferably is formed as part of the electrode structure. Signal-feeding lines 42a are formed to extend from the rectangular-frame-shaped power-feeding line 42c so as to be connected to the pad electrodes 4a, which are signal terminals. In addition, ground feeding lines 42b extend from the power feeding line 42c to the pad electrodes 4b, which are connected to the ground potential.

In addition, extraction electrodes 43 are formed so as to be electrically connected to the ground feeding lines 42b. The signal feeding lines 42a are electrically connected to the extension electrodes 43 via the power-feeding line 42c and the ground feeding lines 42b.

In addition, the extraction electrodes 43 extend parallel or substantially parallel to a pair of opposing sides of the rectangular-frame-shaped power feeding line 42c. A direction in which the extraction electrodes 43 extend is a Y direction and a direction within the plane of the piezoelectric substrate and perpendicular to the Y direction is an X direction. The signal feeding lines 42a are not provided at the pair of opposing sides of the power feeding line 42c. That is, the signal-feeding lines 42a are electrically connected to portions of the power-feeding line 42c located on the remaining pair of sides.

The electrode structure including the signal-feeding lines 42a, the ground feeding lines 42b and the extraction electrodes 43 are preferably formed by performing patterning using photolithography, similarly to as in the first preferred embodiment.

Next, as illustrated in FIG. 23 and FIGS. 24A to 24C, a frame member 7C is formed by patterning photosensitive resin, similarly to as in the first preferred embodiment. The frame member 7C includes a rectangular-frame-shaped frame member body. This rectangular-frame-shaped frame member body is provided so as to surround the functional circuit. In addition, the first and second through holes 7a and 7b are formed in corner portions of the rectangular-frame-shaped frame member body, similarly to as in the first preferred embodiment. In this preferred embodiment, partition walls 7C1 are formed to protrude in the Y direction. The partition walls 7C1 extend from corner portions of the rectangular-frame-shaped frame member body to the edges of the mother piezoelectric substrate 1.

As a result of providing the partition walls 7C1, regions outside of the frame member body of the frame member 7C are divided into first regions D and second regions E. Here, the first regions D are regions located between the partition walls 7C1 extending in the Y direction. The second regions E are regions located outside of the partition walls 7C1 extending in the Y direction. The extraction electrodes 43, which are connected to the ground potential as mentioned above, are arranged in the second regions E. That is, the ground feeding lines 42b and the extraction electrodes 43 are electrically connected to each other in the second regions E. In other words, portions of the wiring that is connected to the ground potential are formed so as to extend from the inside to the outside of the frame member 7C.

As a result of providing the partition walls 7C1, as will be described below, the shield member 10, which includes a conductive material, does not extend into the first regions D. Consequently, unwanted short circuits are prevented.

In the manufacturing method of this preferred embodiment as well, the frame member 7C is formed after forming the electrode structure similarly to as in the second and third preferred embodiments. However, the frame member 7C including the partition walls 7C1 is formed. Next, the first and second conductive members 8a and 8b are formed by electrolytic plating using the signal-feeding lines 42a and the ground feeding lines 42b. Since electrolytic plating is used, first and second conductive members 8a and 8b having a large thickness can be easily formed. Next, dicing tape is adhered from above.

Then, the mother piezoelectric substrate is diced. When the mother piezoelectric substrate is diced, dicing is not performed on portions outside of regions surrounded by alternate long short dash lines G1 and G2 out of portions surrounded by broken lines F1 and F2 in FIG. 25. In addition, when performing the dicing, regions surrounded by the alternate long short dash lines G1 and G2 are removed by cutting. That is, portions between adjacent extraction electrodes 43 of adjacent electronic components are removed. The extraction electrodes 43 are exposed at the cut sectional surfaces formed by the dicing.

After the dicing, in a state in which the dicing tape has not been removed, conductive paste is applied from the lower surface side and cured, similarly to as in the first to third preferred embodiments. In this way, the shield member is formed. Then, portions of the shield member and the cover member between adjacent electronic components are cut. In this way, the electronic component 41 illustrated in FIG. 19 and FIG. 20 is obtained.

In the electronic component 41 of this preferred embodiment, since the cover member is provided, unwanted short circuiting of the first and second conductive members 8a and 8b is effectively prevented. In addition, in this preferred embodiment, since the shield member 10 is formed similarly to as in the first preferred embodiment, the functional circuit is electromagnetically shielded with certainty. As illustrated in FIG. 20C, the shield member 10 is not formed on side surfaces that extend in the X direction as described above. Despite this, since the other two side surfaces are covered by the shield member 10, the functional circuit is sufficiently electromagnetically shielded.

Figure 26:
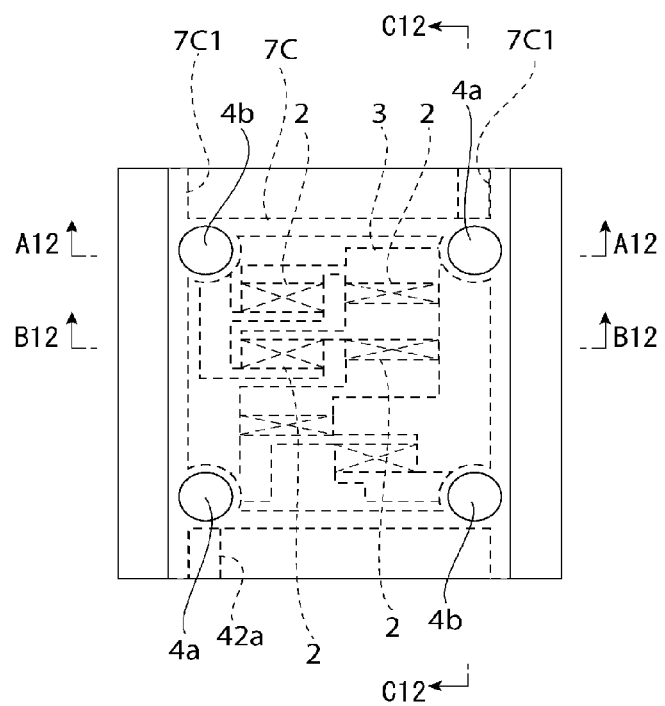
FIG. 26 is a plan view for explaining a manufacturing method for an electronic component of a fifth preferred embodiment of the present invention.
Figure 27A:
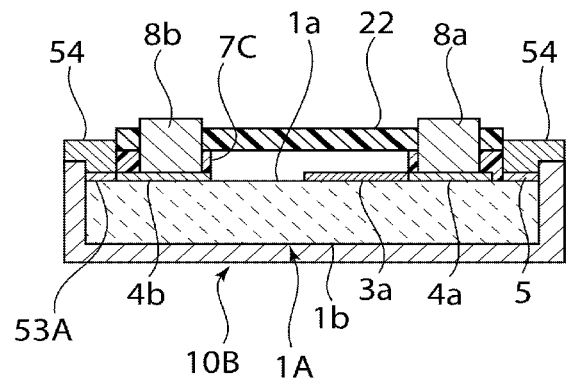
FIGS. 27A to 27C are sectional views taken along the line A12-A12, the line B12-B12 and the line C12-C12 in FIG. 26.
Figure 27B:
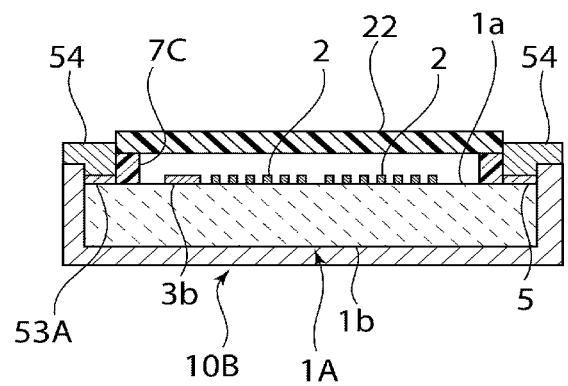
Figure 27C:
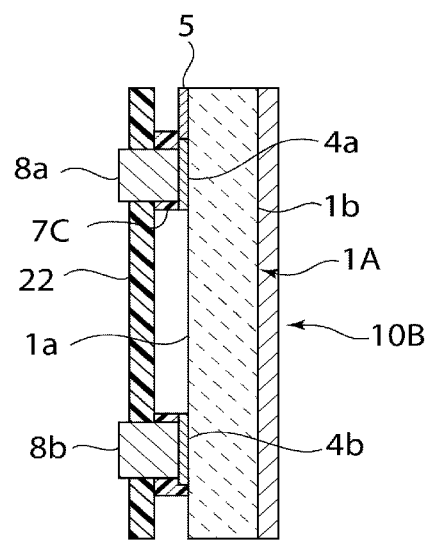

FIG. 26 a plan view illustrating an electronic component according to a fifth preferred embodiment of the present invention and FIGS. 27A to 27C are sectional views taken along the line A12-A12, the line B12-B12 and the line C12-C12 in FIG. 26. In this preferred embodiment as well, the first and second conductive members 8a and 8b can be formed by electrolytic plating, similarly to as in the fourth preferred embodiment.

Figure 28A:
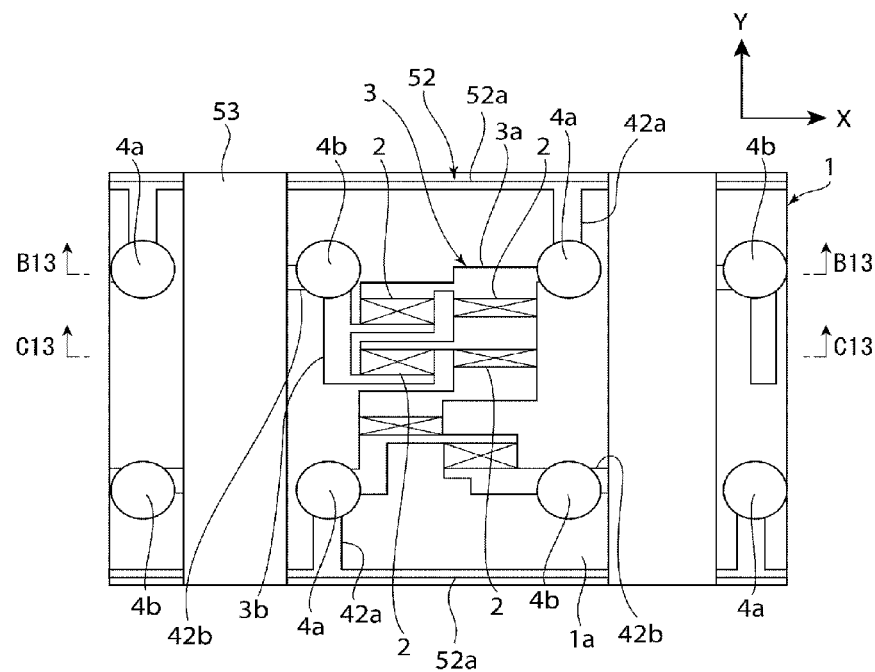
FIG. 28A is a plan view for explaining the manufacturing method for the electronic component according to the fifth preferred embodiment of the present invention.
Figure 28B:
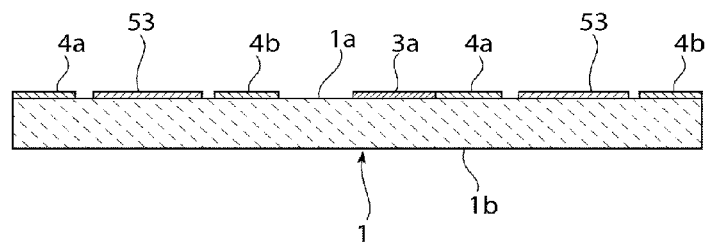
FIG. 28B and FIG. 28C are sectional views taken along the line B13-B13 and the line C13-C13 in FIG. 28A.
Figure 28C:
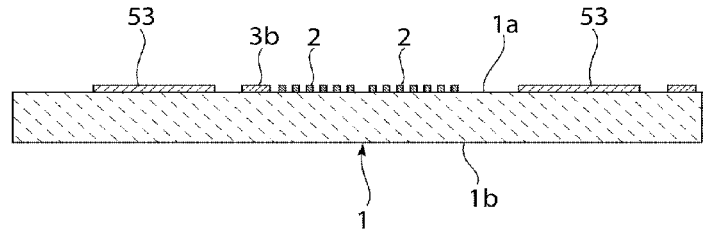

A manufacturing method of this preferred embodiment will be described with reference to FIG. 28. Similarly to as in the first preferred embodiment, an electrode structure is formed on a mother piezoelectric substrate 1. However, in this preferred embodiment, as illustrated in FIGS. 28A to 28C, a power-feeding line 52 and extraction electrodes 53 are formed in addition to the signal wiring 3a, the ground wiring 3b and the pad electrodes 4a and 4b for the plurality of IDTs 2. In this preferred embodiment, the extraction electrodes 53 double as portions of the power feeding line 52. That is, the extraction electrodes 53 are formed so as to extend to an upper edge in the Y direction in FIG. 28A. In addition, the extraction electrodes 53 are formed so as to lie between adjacent electronic components. The power-feeding line 52 includes power-feeding line portions 52a that extend in the X direction. Ends of the power-feeding line portions 52a are disposed so as to connect the pair of extraction electrodes 53 to each other. Thus, a rectangular-frame-shaped power-feeding line is formed by the power-feeding line portions 52a and the extraction electrodes 53. The signal-feeding lines 42a are connected to the power-feeding line portions 52a. This is the same as in the case described in the fourth preferred embodiment. On the other hand, the ground feeding lines 42b are connected to the extraction electrodes 53.

Except for the difference in the structure of the power-feeding line described above, the fifth preferred embodiment is the same as the fourth preferred embodiment.

In the manufacturing method of this preferred embodiment as well, the frame member 7C is formed after forming the electrode structure similarly to as in the fourth preferred embodiment. In this preferred embodiment as well, the frame member 7C is formed so as to include partition walls 7C1, similarly to as in the fourth preferred embodiment.

Next, the frame member is formed by photolithography using a photosensitive resin similarly to as in the fourth preferred embodiment. Next, in this preferred embodiment, metal is caused to accumulate on the pad electrodes 4a and 4b and the extraction electrodes 53 by plating. As a result, the first and second conductive members 8a and 8b are formed. In addition, a metal film 54 illustrated in FIGS. 27A and 27B is formed on the extraction electrodes 53 in the plating step.

Then, portions other than those where the first and second conductive members 8a and 8b are located are covered with a resist and a plating metal film is deposited such that the film thickness of the first and second conductive members 8a and 8b is large. In FIG. 27A, this plating metal film is not specifically illustrated.

Then, dicing tape is affixed from above and the mother piezoelectric substrate is diced, similarly to as in the fourth preferred embodiment. At the time of cutting, cutting is performed such that portions of the extraction electrodes 53 that lie between adjacent electronic components are removed. Therefore, the extraction electrodes 53A come to be exposed at the cut sectional surfaces.

Then, similarly to as in the first to fourth preferred embodiments, conductive paste is applied from the lower surface side and thermally cured, such that the shield member is formed. Then, portions of the shield member and the cover member that lie between adjacent electronic components are cut. In this way, the electronic component of this preferred embodiment is obtained.

In this preferred embodiment as well, the first and second conductive members 8a and 8b can be formed by electrolytic plating, similarly to as in the fourth preferred embodiment.

In addition, in the above-described first to fifth preferred embodiments of the present invention, a functional circuit preferably is provided so as to define a ladder filter, but in the present invention, the functional circuit is not limited to this type of filter and may be a filter that is a suitable combination of a longitudinally coupled resonator type filter and a transversely coupled resonator type filter and further is not limited to being a functional circuit section that utilizes elastic waves such as surface acoustic waves. That is, the present invention can be applied to sections having various functional circuits that require electromagnetic shielding.

In addition, the circuit substrate is not limited to the piezoelectric substrate 1 and the present invention can also be applied to electronic components that include an insulating substrate or a semiconductor substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
    a circuit substrate including first and second main surfaces that oppose each other, and side surfaces that connect the first and second main surfaces to each other;
    a functional circuit that is located on the first main surface of the circuit substrate;
    signal wiring that is located on the first main surface of the circuit substrate and is electrically connected to the functional circuit;
    ground wiring that includes a wiring portion located on the first main surface of the circuit substrate, that is electrically connected to the functional circuit and that is electrically connected to a ground potential; and a frame member that is arranged to secure a region between the frame member and an outer peripheral edge of the first main surface of the circuit substrate and so as to surround the functional circuit; wherein the ground wiring extends from inside to outside the frame member; and a shield member extends from the second main surface of the circuit substrate to a region outside the frame member on the first main surface of the circuit substrate via the side surfaces, the shield member including a conductive material so as to be electrically connected to the ground wiring in the region outside the frame member.

2. The electronic component according to claim 1, further comprising a partition wall that extends to the outer peripheral edge of the first main surface from an outer peripheral edge of the frame member; wherein the region outside of the frame member is divided into a first area and a second area by the partition wall, the ground wiring is arranged in the first area and the signal wiring extends into the second area.

3. The electronic component according to claim 1, wherein the shield member covers an entirety of each of the second main surface and the side surfaces of the circuit substrate.

4. The electronic component according to claim 1, further comprising a cover member that is bonded to the frame member so as to close an opening of the frame member.

5. The electronic component according to claim 1, wherein the frame member includes a first through hole that faces the signal wiring and a second through hole that faces the ground wiring, the electronic component further comprising first and second conductive members with which the first and second through holes are filled.

6. The electronic component according to claim 5, further comprising:

a cover member that is bonded to the frame member so as to close an opening of the frame member; wherein the cover member includes third and fourth through holes that are continuous with the first and second through holes, and the first and second conductive members respectively extend into the third and fourth through holes.

7. The electronic component according to claim 5, wherein heights of the first and second conductive members are larger than that of the frame member.

8. The electronic component according to claim 5, wherein the first and second conductive members define and function as bumps or under bump metal layers.

9. The electronic component according to claim 1, wherein the electronic component is a surface acoustic wave device.

10. The electronic component according to claim 1, wherein the shield member is lower than an upper end of the frame member on the first main surface of the circuit substrate on which the functional circuit is provided.

11. The electronic component according to claim 1, wherein the shield member includes a protruding frame that protrudes upward from a portion that covers the side surfaces of the circuit substrate.

12. The electronic component according to claim 11, further comprising a cover member that is bonded to the frame member so as to close an opening of the frame member, wherein the cover member is located in a region that is surrounded by the protruding frame.

13. The electronic component according to claim 12, wherein an upper surface of the cover member is lower than upper ends of the first and second conductive members.

14. The electronic component according to claim 1, further comprising a cover member that is bonded to the frame member so as to close an opening of the frame member, wherein the cover member extends to an outer peripheral edge of the electronic component.

15. The electronic component according to claim 1, wherein the functional circuit defines one of a ladder filter and a combination of a longitudinally coupled resonator type filter and a transversely coupled resonator type filter.

16. The electronic component according to claim 1, wherein the circuit substrate is one of a piezoelectric substrate, an insulating substrate, and a semiconductor substrate.

17. A method of manufacturing an electronic device, comprising:

(A) a step of preparing a circuit substrate including first and second main surfaces that oppose each other, and side surfaces that connect the first and second main surfaces to each other;

(B) a step of forming a functional circuit on the first main surface of the circuit substrate;

(C) a step of forming, on the first main surface of the circuit substrate, signal wiring that is electrically connected to the functional circuit, and ground wiring that is electrically connected the functional circuit and that is electrically connected to a ground potential;

(D) a step of forming a frame member on the first main surface of the circuit substrate so as to surround the functional circuit and so as to secure a region between the frame member and an outer peripheral edge of the circuit substrate; and (E) a step of forming a shield member that includes a conductive material such that the shield member extends from the second main surface of the circuit substrate to a region outside the frame member on the first main surface via the side surfaces and so that the shield member is electrically connected to the ground wiring.

18. The method of manufacturing an electronic component according to claim 17, wherein the steps (A) to (E) are performed on a mother circuit substrate and a plurality of electronic component forming sections are formed on the mother circuit substrate with the shield member extending between adjacent electronic component forming sections; and the mother circuit substrate, on which the plurality of electronic component forming sections are formed, and the shield member are divided into individual electronic components by being cut.

19. The method of manufacturing an electronic component according to claim 17, further comprising a step of forming a cover member so as to close an opening of the frame member.

20. The method of manufacturing an electronic component according to claim 17, further comprising a step of forming a partition wall that extends toward the outer peripheral edge of the first main surface of the circuit substrate from the frame member, so that the region is divided into a first area and a second area by the partition wall; wherein the partition wall is formed such that the ground wiring is located in the first area and the signal wiring is located in the second area.

* * * * *